United States Patent
Steffen et al.

(10) Patent No.: US 7,756,516 B2
(45) Date of Patent: Jul. 13, 2010

(54) HIGH-FREQUENCY MEASURING SYSTEM HAVING SPATIALLY SEPARATED HIGH-FREQUENCY MODULES

(75) Inventors: Roland Steffen, Bad Endorf (DE); Ralf Plaumann, Forstern (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 10/563,030

(22) PCT Filed: May 27, 2004

(86) PCT No.: PCT/EP2004/005728

§ 371 (c)(1), (2), (4) Date: May 18, 2006

(87) PCT Pub. No.: WO2005/001491

PCT Pub. Date: Jan. 6, 2005

(65) Prior Publication Data

US 2006/0258293 A1 Nov. 16, 2006

(30) Foreign Application Priority Data

Jun. 30, 2003 (DE) ................................ 103 29 396

(51) Int. Cl.
*H04Q 7/20* (2006.01)

(52) U.S. Cl. .................... 455/425; 455/67.13; 455/423; 455/456

(58) Field of Classification Search .............. 455/67.11, 455/423, 67.13, 67.3, 456, 63, 431, 315, 455/425

See application file for complete search history.

(56) References Cited

U.S. PATENT DOCUMENTS

| | | | | |
|---|---|---|---|---|
| 5,170,126 A | * | 12/1992 | Wedge et al. | 324/613 |
| 5,589,833 A | * | 12/1996 | Randall et al. | 342/195 |
| 5,970,395 A | * | 10/1999 | Weiler et al. | 455/67.13 |
| 6,211,663 B1 | * | 4/2001 | Moulthrop et al. | 324/76.23 |
| 6,243,576 B1 | * | 6/2001 | Seike et al. | 455/423 |
| 6,434,501 B1 | * | 8/2002 | Cherrette et al. | 702/120 |
| 2001/0021899 A1 | | 9/2001 | Schinkowitsch | |
| 2004/0066207 A1 | * | 4/2004 | Bottoms et al. | 324/754 |
| 2004/0106380 A1 | * | 6/2004 | Vassiliou et al. | 455/73 |

FOREIGN PATENT DOCUMENTS

DE 3933222 A1 4/1991

(Continued)

OTHER PUBLICATIONS

Agilent technologies"RF and Mocrowave PNA Network Analyzers" Sep. 25, 2002, pp. 1-2 (IDS NPL XP 002300578).*
NPL document: Agilent PNA network analyzers, dated: Sep. 25, 2002.*

(Continued)

*Primary Examiner*—Duc Nguyen
*Assistant Examiner*—Ajibola Akinyemi
(74) *Attorney, Agent, or Firm*—Ditthavong Mori & Steiner, P.C.

(57) ABSTRACT

A high-frequency measuring system is provided for measuring a test device with a measuring device unit and at least one high-frequency module connected to the measuring device unit. Each high-frequency module is located spatially separated from the measuring device unit and is connected to the measuring device unit via a digital interface.

17 Claims, 3 Drawing Sheets

FOREIGN PATENT DOCUMENTS

| | | |
|---|---|---|
| DE | 4322046 A1 | 1/1995 |
| DE | 19857834 A1 | 10/1999 |
| DE | 10034308 A1 | 2/2001 |
| WO | WO 98/45720 | 10/1998 |
| WO | WO 00/69196 | 11/2000 |

OTHER PUBLICATIONS

PCT/EP2004/005728, International Preliminary Report on Patentability, May 26, 20006.

Anonymous, "RF and Microwave PNA Network Analyzers," Internet Article, Sep. 25, 2002, pp. 1-2, XP-002300578.

* cited by examiner

HIGH-FREQUENCY MEASURING SYSTEM HAVING SPATIALLY SEPARATED HIGH-FREQUENCY MODULES

FIELD OF THE INVENTION

The invention relates to a measuring system for high-frequency communications systems.

BACKGROUND OF THE INVENTION

In the development and production of devices for high-frequency communications systems, such as digital mobile telephone or WLAN (wireless local area network), it is desirable to check the performance of the relevant devices or component groups with regard to data transmission or message transmission. Measuring instruments connected directly by means of a cable to the antenna port of the device under test (DUT) are generally used for this purpose. If the device under test has only a permanently-installed internal antenna, an antenna coupler, which establishes the connection with the antenna of the device under test by electromagnetic coupling, is inserted between the device under test and the end of the cable.

The high-frequency signals to be transmitted or respectively received are passed along the cable. In order to test a mobile-telephone device, for example, bit sequences are generated by the measuring device and transmitted after appropriate modulation to the mobile-telephone device under test, wherein the corresponding transmitter unit of the measuring device adjusts various parameters, such as the level or the frequency of the transmitted signal, in order to observe given test conditions. For example, one measuring device of this kind emulates a base station of a real mobile telephone network, so that the measuring device comprises high-frequency transmitter and/or receiver devices as integral components in addition to the components actually required to implement a test run.

The measuring device in a test station used for testing the devices in a high-frequency communications system is generally installed in a rack, which also generally contains other measuring devices for implementing other measuring tasks. The high-frequency signals received from the device, and the high-frequency signals generated and transmitted by the device are transmitted respectively from or to the device under test via a cable connection.

Transmitting high-frequency signals via cable is associated in principle with substantial disadvantages. The attenuation of the cable is dependent upon the length of the cable itself, the signal frequency and the type of cable and influences the accuracy, with which signals are supplied to the device under test, and also the accuracy, with which transmissions from the device under test can be measured. Complex corrective calculation methods can reduce these effects in the determination of the true measured values, but can never completely eliminate them. A further difficulty is that the high-frequency properties of a cable can change over time, for example as a result of mechanical stress. On the one hand, the attenuation of the cable means that the measuring device must generate a higher level than is required directly in the device under test, which, especially in the case of high-frequencies, makes the measuring devices more expensive. Weak signals transmitted from the device under test may fall below the detection threshold of the measuring device as a result of the cable attenuation, so that, under some circumstances, more expensive, sensitive measuring devices are required.

With an increasing length of cable, not only are these effects intensified, but the risk is also increased that interference signals (for example, from the base stations disposed in the proximity of the building, in which the test station is located) can penetrate through the final shielding of the cable and thereby falsify the measurement.

Furthermore, cables generally have a negative effect on the standing wave ratio (VSWR, voltage standing wave ratio) of measuring devices and therefore lead to additional measurement and stimulus uncertainties.

In summary, for the above reasons, the length of the cable between the device under test and the measuring device should be kept as short as possible. However, this is in contradiction with conventional practice at test stations, which demands a spatial separation of the device under test from the measuring device for reasons of space, for example, for conveyor belts, handling systems, pneumatically-controlled test adapters, and with regard to the space requirements of the measuring devices themselves.

In view of the rapidly-changing technology, measuring devices must become increasingly universal and future-orientated. It must be possible to expand the devices for functions, which are currently not yet required or which, under some circumstances, are not even known at the time of purchasing the device. Examples of such expansions could be the covering of further frequency and level ranges, new mobile-telephone standards, the number of independently usable transmission and reception models, for example, in order to test more than one device under test at the same time.

For specialized applications, it is sometimes also meaningful to derive devices with a reduced performance scope and at lower cost from existing measuring-device designs. Possible solutions in this context may be found in the modularity of the measuring device, as disclosed, for example, in published German patent application DE 198 57 834 A1. However, plug-in designs are subject to limitations, which are determined by the availability of space, the heat removable from the device, which determines the maximum-permissible power consumption of the modules, and is determined by the performance of the power pack, which is generally installed in a fixed manner.

SUMMARY OF THE INVENTION

There exists a need for a measuring system, which reduces the negative effects on the high-frequency signal over the transmission path between the device under test and a high-frequency unit, and which allows a simplified calibration.

In accordance with one aspect of the present invention, in one embodiment, a measuring-device unit can be connected to at least one high-frequency module, which can be placed spatially separately, a digital interface being provided as the interface between the high-frequency module and the measuring-device unit. Accordingly, the high-frequency module, which is not integrated in the measuring-device unit installed in the rack, can be placed close to the device under test, thereby significantly reducing the necessary transmission paths for the high-frequency signal. Negative effects on the quality of the high-frequency signal are thereby eliminated. By contrast, data are transmitted between the measuring-device unit and the at least one high-frequency module exclusively in a digital manner, so that this transmission path has no negative influence on the quality of the signal.

Since the information is transmitted digitally between the measuring-device unit and the respective high-frequency module, every high-frequency module can, in particular, be calibrated independently of the measuring-device unit, to which it is connected. For example, in the case of a desired new-calibration of a high-frequency module, the measuring-device unit can remain installed in the rack, and the other modules can continue to be used, while only the respective high-frequency module is separated from the measuring-device unit and sent back, for example, to the manufacturer or to a service-support agency for calibration. During this time, another, already-calibrated high-frequency module can be connected to the measuring-device unit as a substitute, thereby achieving a considerably reduced logistical expenditure and a considerable reduction of downtime. In particular, a rapid and simple changing of the modules is possible, without having to open a housing shielded against high-frequency radiation and then having to seal it firmly again.

It is particularly advantageous in one embodiment to provide several ports for the at least one digital interface on the measuring-device unit, so that several high-frequency modules can be connected to the measuring-device unit at the same time. As a result, it is possible to use several high-frequency modules with an exactly-defined, limited functional scope, for example, one high-frequency module as a transmitter unit and a second high-frequency module as a receiver unit, or alternatively, to provide one high-frequency module for each different measuring task, each of which is connected to the measuring-device unit only when desired. As a result of the possibility of connecting several high-frequency modules to the measuring-device unit, the structural size of the individual high-frequency modules can be reduced, so that, once again, the handling of the high-frequency modules is simplified, which has further advantageous effects in an arrangement close to the device under test.

According to another aspect, a high-frequency module can be fitted with a separate power supply, so that high-frequency modules, which have a high DC power requirement, for example, high-frequency modules with a considerable transmission power, can also be used. The separate power supply, which is either integrated in the housing of the high-frequency module or arranged externally, therefore renders unnecessary a supply of DC power via the measuring-device unit and the connecting line.

Moreover, in one embodiment, an optimum adaptation to the respective measuring task can be achieved by providing several digital interfaces on the measuring-device unit, which are formed, for example, both as serial interfaces and also as parallel interfaces, wherein the interfaces can especially be formed either as optical interfaces or electrical interfaces. In particular, these interfaces can be adapted to the respective measuring task, for which a given high-frequency module is used. If a different type of interface achieves improved measuring conditions for different measuring task, for example, optical instead of electrical, a different high-frequency module can be connected to the appropriate interface.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawings and description are to be regarded as illustrative in nature, and not as restrictive.

BRIEF DESCRIPTION OF THE DRAWINGS

A preferred exemplary embodiment of the measuring system according to the invention is explained in greater detail in the description below with reference to the drawings. The drawings are as follows.

DETAILED DESCRIPTION OF THE PREFERRED EMBODIMENT

Figure 1:
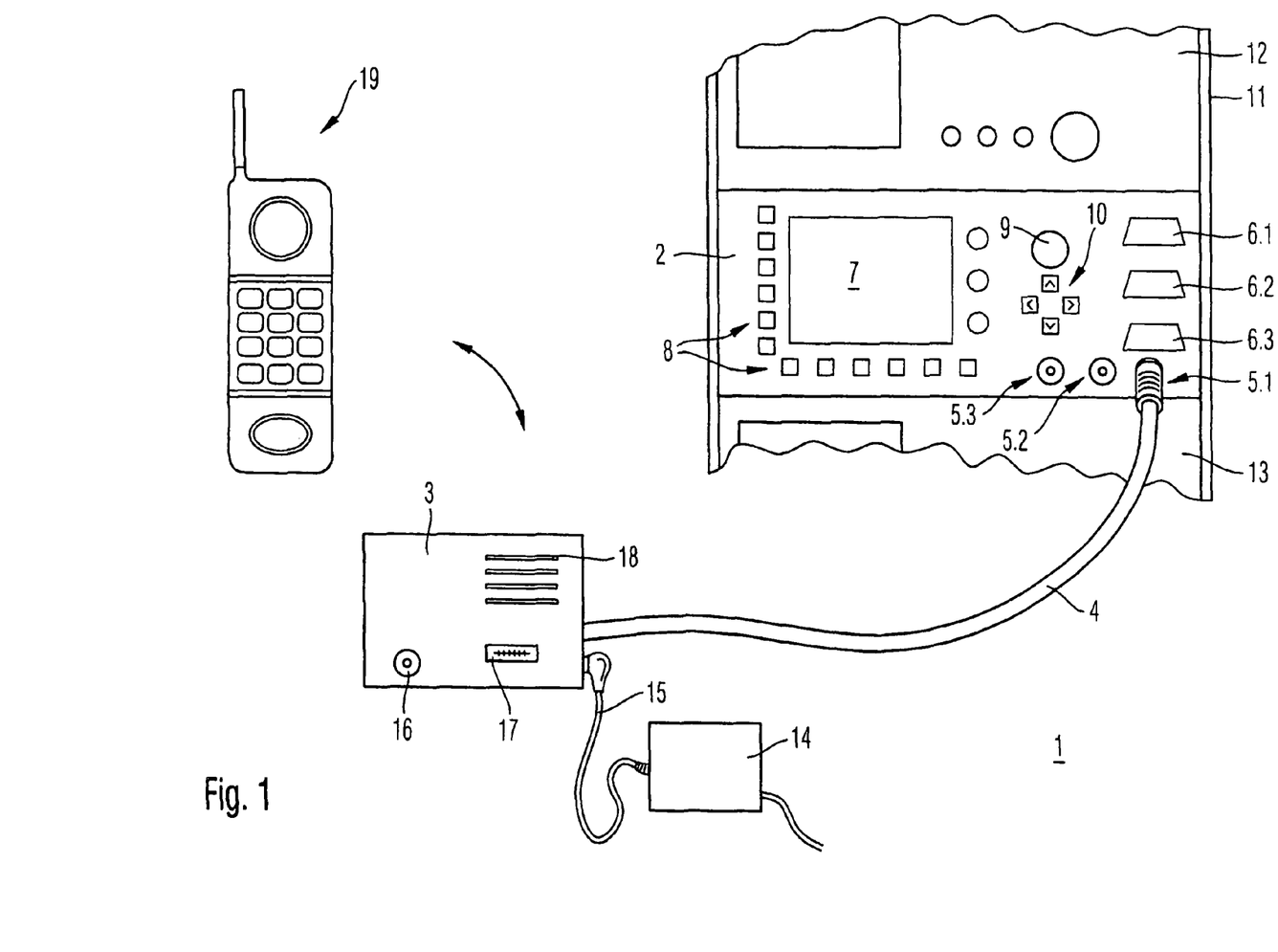
FIG. 1 shows a schematic presentation of the structure of a measuring system consistent with the invention.

A measuring system 1 consistent with the invention, as illustrated in FIG. 1, comprises a measuring-device unit 2, which is connected, in the exemplary embodiment shown, to only one high-frequency module 3. The high-frequency module 3 is connected to the measuring-device unit 2 via a connecting cable 4, the high-frequency module 3 being connected to a first socket 5.1 by means of the connecting cable 4. A second socket 5.2 and a third socket 5.3, which are identical, for example in their structure, to the first socket 5.1, are provided on the measuring-device unit 2.

In the illustrated exemplary embodiment, the measuring-device unit 2 provides three further connecting options 6.1, 6.2 and 6.3 for high-frequency modules, thereby providing, for example, an alternative connecting option to the three sockets 5.1, 5.2 and 5.3. For instance, the three sockets 5.1, 5.2 and 5.3 can form a serial, optical interface, while the three connecting options 6.1 to 6.3 can realize a parallel, electrical interface.

The measuring-device unit 2 provides a display device 7, for example, a display, which is disposed on the front panel of the measuring-device unit 2. A row of operating keys 8, by means of which the parameters and functions for the implementation of a measuring task are entered, is also provided on the front panel of the measuring-device unit 2. A rotary knob 9 and arrow keys 10 are also provided for this purpose, for example, so that a frequency range for a transmission signal can be tuned in a simple manner by rotating the rotary knob 9, or various menu items displayed on the display device 7 can be selected using the arrow keys 10.

The measuring task defined via the operating keys 8 and the rotary knob 9 or respectively the arrow keys 10 is processed in the measuring-device unit 2 in such a manner that only a bit sequence, which contains information, for example, regarding the level of a high-frequency signal to be transmitted and the data to be transmitted in the signal, is transmitted, for example, via a serial digital interface, to the high-frequency module 3.

All of the entries are made in a manner already familiar to an operator from known measuring devices, on the front panel of the measuring-device unit 2, which is installed, for example, in a rack 11, where it is accessible. Two further measuring devices 12 and 13 are arranged above and respectively below the measuring device 2 in the rack 11 as illustrated in FIG. 1. As has already been explained, the operation of the measuring system according to the invention is limited in a known manner to an operating panel of the measuring-device unit 2. Dependent upon the entry by an operator, the measuring-device unit 2 transmits data in digital form to the high-frequency module 3, wherein a high-frequency signal is generated and/or received and processed within this high-frequency module 3. The high-frequency signals are therefore processed outside the measuring-device unit 2.

In the exemplary embodiment illustrated, a mobile-telephone device 19 is provided as the device under test, so that the measuring system 1 illustrated can be, for example, a system tester or protocol tester for testing mobile-telephone devices 19. For this purpose, a first connecting option 16 and a second connecting option 17 are provided in the high-frequency module 3, wherein, by contrast with the three sockets 5.1 to 5.3 or respectively connecting options 6.1 to 6.3, the high-frequency signal is transmitted via this first connecting option 16 or respectively second connecting option 17.

In this context, the first connecting option 16 or respectively the second connecting option 17 is provided either for the connection of an antenna or preferably for direct connection to a device under test, that is to say, in the exemplary embodiment presented, via an appropriate line to the mobile-telephone device 19.

If the high-frequency module 3 contains components, which have a considerable power requirement, for example, an amplifier, the power requirement of the high-frequency module 3 can be provided via a separate power supply 14, that is to say, a power supply independent from the power supply for the measuring-device unit 2. The separate power supply 14 in the exemplary embodiment presented is connected to the high-frequency module 3 via a power cable 15 and then to the main power supply via a power cable, which is not fully shown in the drawing. A separate power supply 14 of this kind can also be integrated in the high-frequency module 3, so that, only one additional main cable needs to be connected to the main supply.

Conversely, a separate power supply 14, which is arranged in its own housing as illustrated in FIG. 1, can also be used for several high-frequency modules. This not only prevents the negative effects of a proximity between the power pack of the separate power supply and the high-frequency components of the high-frequency modules, but also exploits an additional potential for saving costs.

A further advantage is achieved by the use of a high-frequency module, which communicates with the measuring-device unit 2 via a digital interface, in that a cooling unit specifically adapted for the respective high-frequency module 3 can be used, as indicated by the ventilation slots 18 in the high-frequency module 3 shown in FIG. 1. By contrast, the cooling unit for a measuring device with integrated high-frequency components may merely represent a compromise for all of the components involved, wherein the spatial proximity of the heat-generating components in a combined housing makes cooling more difficult.

Figure 2:
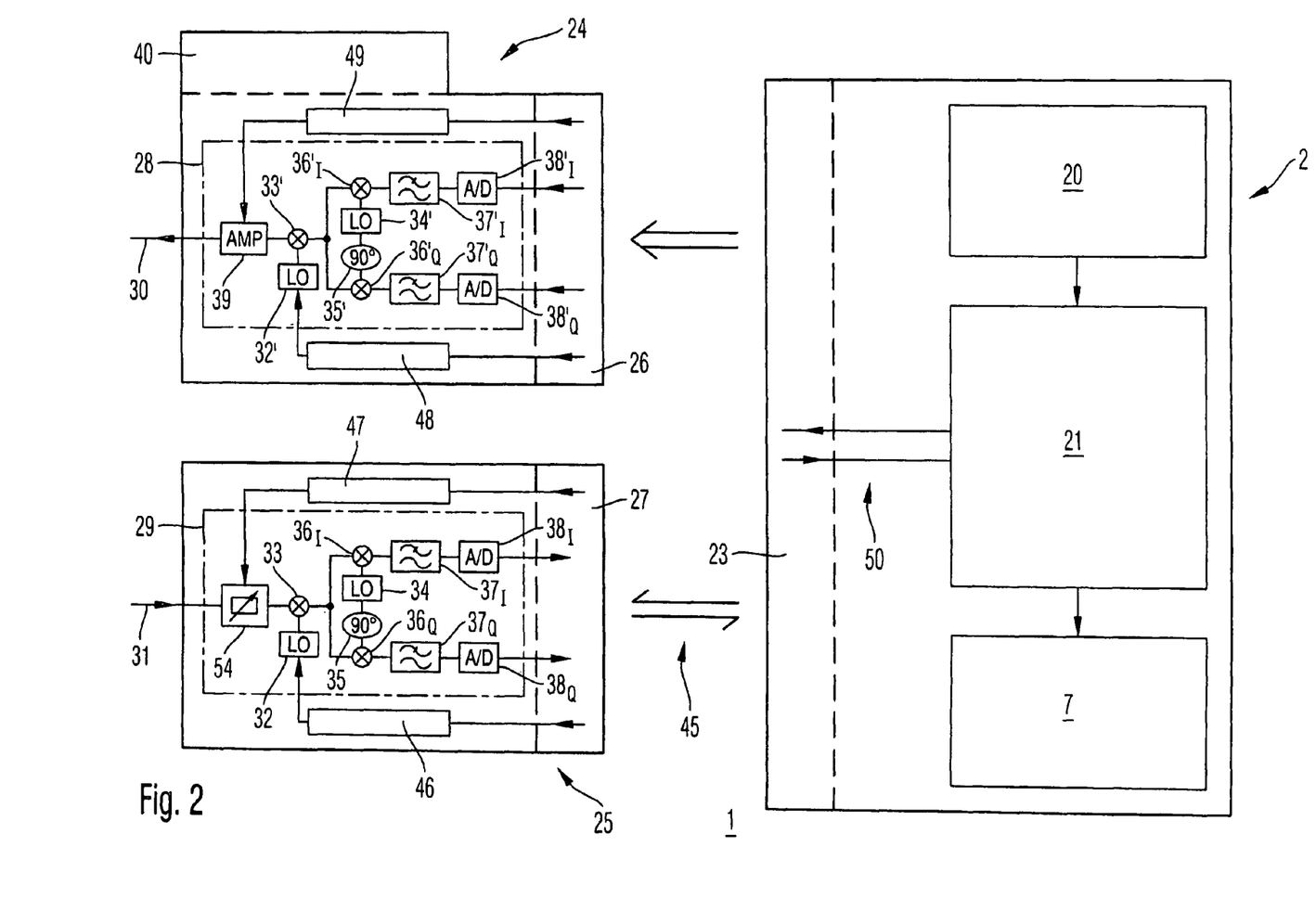
FIG. 2 shows a simplified block circuit diagram of an exemplary embodiment of a measuring system consistent with the invention.

FIG. 2 shows a first exemplary embodiment of a measuring system consistent with the invention, to which two high-frequency modules are connected. The measuring-device unit 2 comprises an input block 20, which represents all of the input media, for example, the operating keys 8, the rotary knob 9 and the arrow keys 10, arranged on the operating panel of the measuring-device unit 2. The parameters entered and functions opened by an operator via the input block 20 are communicated to a calculation and evaluation unit 21.

Dependent upon the operator's entries in the entry block 20, the calculation and evaluation unit 21 determines which bit sequence must be transmitted, for example, to a mobile-telephone device under test. In addition to the data actually to be transmitted, which are communicated from the mobile-telephone device 19 to the high-frequency module 3, control signals are generated by the central calculation and evaluation unit 21 in the bit sequence and communicated to the high-frequency module for the control of the high-frequency module.

In the first exemplary embodiment illustrated, a bitstream is transmitted via the digital interface; however, this bitstream is only modulated by the high-frequency module 24 and then transmitted. The processing of the signals from the input data is still implemented in the measuring-device unit through the assignment (mapping) of the symbols onto states in the state diagram of the I-Q phase (inphase-quadrature phase level).

In addition to generating digital data, which are transmitted via the digital interface to the high-frequency modules, the calculation and evaluation unit 21 can also obtain bit sequences from one or more high-frequency modules 3 and subject them to an evaluation. For example, a message signal transmitted from a mobile-telephone device under test 19 can be received by a high-frequency module 3 with a receiver unit and de-modulated by the high-frequency module 3, and the user data, which are contained in the signal, can be communicated via the digital interface to the calculation and evaluation unit 21. A bit error rate or block error rate, for example, is then determined from these data without a necessity for the measuring-device unit 2 to process a high-frequency signal.

The calculation and evaluation unit 21 is connected to the display device in order to display the measured results and to allow a checking of the parameters and functions entered via the input block 20.

To communicate the digital data to a high-frequency module 3 or respectively to receive a bitstream from a high-frequency module 3, a digital interface unit 23 is provided in the measuring-device unit 2. In the example illustrated in FIG. 2, a first high-frequency module 24 and a second high-frequency module 25 are shown. The first high-frequency module 24 and the second high-frequency module 25 each have one interface unit 26 and 27 respectively, which can be connected to the digital interface unit 23 of the measuring-device unit 2, and which therefore form the digital interface of the measuring system. As already described with reference to FIG. 1, the digital interface can be designed to be both optical and also electrical. Accordingly, a corresponding electrical or optical connecting line is provided in order to connect the interface unit 26 of the high-frequency module 24, or respectively of the interface unit 27 of the high-frequency module 25, to the digital-interface unit 23 of the measuring-device unit 2.

The first high-frequency module 24 comprises a transmitter device 28, and the second high-frequency module 25 comprises a receiver device 29. A high-frequency transmission signal 30 transmitted from the transmitter device 28 of the first high-frequency module 24 to a device under test, is indicated in FIG. 2.

Similarly, a high-frequency signal 31 arriving at the receiver device 29 of the second high-frequency module 25 is also indicated. The incoming high-frequency signal 31 is mixed in a first mixer 33 with a signal generated by a local oscillator 32 and accordingly converted to an intermediate frequency level. This intermediate-frequency signal is subdivided into an in-phase branch and a quadrature-phase branch and mixed in the in-phase with a signal generated by a second local oscillator 34 in a second mixer 36$_I$, into the baseband.

A phase modifier 35 changes the phase of the signal from the local oscillator 34 before the intermediate-frequency signal is mixed in the second mixer 36$_Q$ in the quadrature-phase branch into the baseband. In each case, the baseband signals pass through a low-pass filter $37_I$, $37_Q$ and are then digitized through analog-to-digital converters $38_I$, $38_Q$. In the simplest case, in which the digital interface is disposed at the level of the baseband signal, the data, now present in digital form, are transmitted via the interface unit 27 of the second high-frequency module 25 and the digital interface unit 23 to the calculation and evaluation unit 21 of the measuring-device unit 2, where further processing of the data is carried out.

In the illustrated exemplary embodiment, the second high-frequency module 25 contains only one de-modulator, illustrated in simplified form, with which the message signals transmitted by the device under test are de-modulated and the digital user data are communicated to the measuring-device unit 2. However, for other measuring tasks, high-frequency modules adapted to the respective task should be provided, so that, for example, a power measurement of the received high-frequency signal is implemented in one high-frequency module, and the power determined is transmitted as a digital value via the digital interface to the measuring-device unit 2.

In addition to the de-modulation of the incoming high-frequency signal 31 and the communication of the bitstream obtained from it to the measuring-device unit 2, as indicated by the arrow 45 running in both directions, data are also transmitted digitally in the opposite direction, that is to say, from the measuring-device unit 2 to the second high-frequency module 25. The digital interface unit 23 and the corresponding interface unit 27 of the second high-frequency module 25 form a bi-directional digital interface.

Such a bi-directional function of the interface is desired, for example, in order to operate a frequency control 46 of the second high-frequency module 25, which then establishes the frequency of the high-frequency signal to be received in the receiver device 29. Moreover, further relevant parameters for the reception of high-frequency signals, for example, the sensitivity corresponding to the specifications of one operator or of the measuring program, can be adjusted via a second control 47, as indicated by the variable attenuation element 54 in FIG. 2, which is connected to the second control 47. Alongside the communication of data from the second high-frequency module 25 to the measuring-device unit 2, a transmission of data is therefore also possible in the opposite direction via the digital interface.

The transmitter device 28 of the first high-frequency module 24 is structured in a similar manner to the receiver device 29 of the second high-frequency module 25. To avoid repetition in reference numbers, the corresponding components of the transmitter device 28 are marked with the same reference numbers as the components of the receiver device 29 but with an additional apostrophe. The transmitter device 28 additionally provides an amplifier 39, with which the high-frequency signal generated can be transmitted with a power adjustable by the operator or by the measuring program.

To set a given frequency, a frequency control 48, which is also controlled by means of a digital-control command communicated via the digital interface, is provided and acts on the local oscillator 32'. To set a given transmission power, a level control 49, which is similarly controlled at the input end by a digital-control command, is additionally provided and acts on the amplification of the amplifier 39 of the transmitter device 28.

To achieve an energy-saving independently of the connection between the interface unit 26 of the first high-frequency module 24 and the digital-interface unit 23 of the measuring-device unit 2, a power supply 40 is provided in the first high-frequency module 24, which, in the exemplary embodiment shown in FIG. 2, is integrated in the first high-frequency module 24. By contrast, modules with a lower energy requirement, as shown, for example, for the second high-frequency module 25, can also be supplied directly via the measuring-device unit 2 without an independent power supply.

The digital data are exchanged between the calculation and evaluation unit 21 and the digital interface unit 23 of the measuring-device unit 2, for example, via a bus system 50. In the illustrated example, a base station for testing mobile-telephone devices is emulated by the measuring system comprising the measuring-device unit 2, the first high-frequency module 24 and the second high-frequency module 25.

The explanations provided for the example of a system tester for mobile-telephone devices do not restrict the applications of measuring systems consistent with the invention. A measuring system consistent with the invention, which allows the local arrangement of high-frequency modules close to a device under test and accordingly achieves a significant reduction of losses on the transmission path of the high-frequency signals, the high-frequency modules being connected via a digital interface to a measuring-device unit 2, can also be used for other high-frequency communications systems, such as WLAN.

A measuring procedure is controlled entirely from the measuring-device unit 2. Only information, which is subsequently converted into a high-frequency signal, for example, by the corresponding high-frequency module, is transmitted via the digital interface. In the reverse direction, in which digital information is communicated from the high-frequency module to the measuring-device unit 2, an incoming high-frequency signal is also processed in the high-frequency module and, for example, a power is measured, wherein the information is communicated via the power, and the signal content from the high-frequency module is communicated via the digital interface and the bus system 50 of the measuring-device unit 2 to the calculation and evaluation unit 21.

In the measuring-device unit 2 or respectively in the calculation and evaluation unit 21 disposed therein, the data are analyzed independently from the high-frequency module on the basis of the information communicated in digital form. A calibration of the high-frequency modules is therefore possible independently of the measuring-device unit 2.

The settings of the high-frequency modules can be changed via the calculation and evaluation unit 21, in that an operator makes corresponding corrections and entries via the input block 20. The corrections are then converted by the calculation and evaluation unit 21 into corresponding digital-control signals and supplied via the digital interface 23 to the corresponding high-frequency module, which converts the control signals. Since digital information can be transmitted with considerably greater security than the transmission of analog parameters, a considerable improvement in the accuracy of implementation of measurements and tests on high frequency communications systems can be achieved with the measuring system as described.

Figure 3:
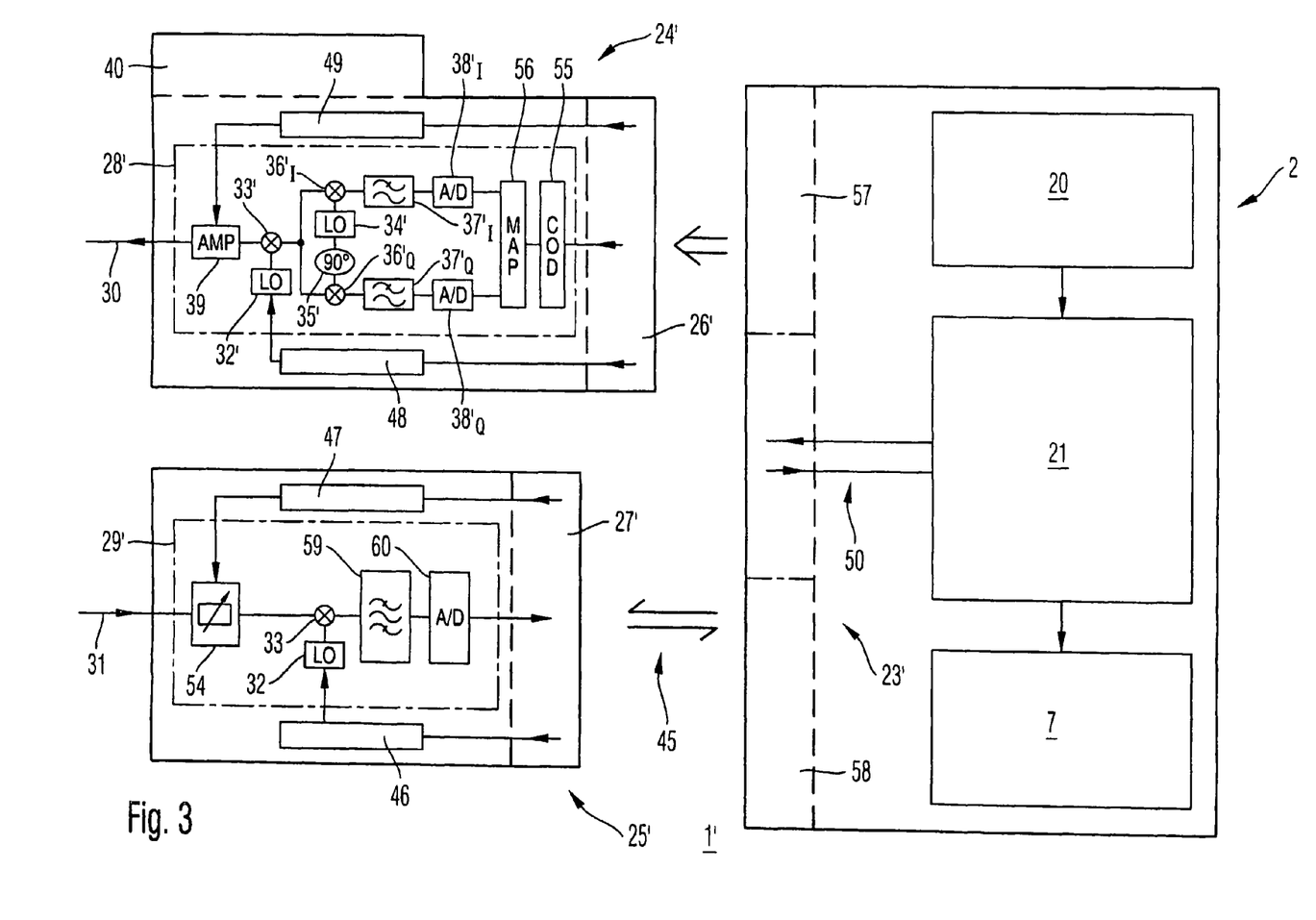
FIG. 3 shows a further schematic presentation with preferred embodiments of the digital interface and the associated high-frequency modules.

FIG. 3 shows further preferred embodiments of the measuring system according to the invention. In each case, all data, which are utilized, on the one hand, for the adjustment of given functional parameters in the relevant high-frequency module, and, on the other hand, which relate to signal data or measuring data, are transmitted in digital form via the digital interface.

With the modified first high-frequency module 24', the transmitter device 28' is expanded by comparison with the exemplary embodiment of FIG. 2 in such a manner that, at the input end of the transmitter device 28', the signals to be transmitted initially pass through a coder 55, and the data encoded and combined into blocks are then passed through a mapping unit 56.

Accordingly, all components, which are utilized for the further processing of user data, as desired, for example, for a given mobile-telephone standard, are localized in the high-frequency module. The user data transmitted in digital form via the digital interface from the measuring-device unit 2 to the modified first high-frequency module 24' are initially transformed by the coder 55 into a bitstream, that is to say, subdivided, for example, into data packages, and provided with supplements appropriate for the respective communications system, for example, by inserting a header or a midample.

The individual bits of the bitstream generated in this manner are then assigned in the example illustrated by the mapping unit 56 to the corresponding states in the I/Q state diagram. Accordingly, all components relating to the conditioning of the high-frequency signal are disposed in the converted, first high-frequency module 24' and the measuring-device unit processes only user data and control signals.

In the exemplary embodiment illustrated, a first portion 57 of the digital-interface unit 23' is used for the transmission of the user data and control signals.

This first portion 57 of the digital-interface unit 23' can therefore be standardized completely independently of the high-frequency module, to which it is to be connected; that is to say, every connected module comprises all of the components, which are required in accordance with the task of the module, for example, in order to condition a signal according to a given transmission standard for the high-frequency signal or according to corresponding specifications for testing individual component groups as a device under test. In this context, the high-frequency module comprises means, for conditioning the data, which are transmitted via the standardized interface independently of the transmission standards for the high-frequency signals, in such a manner that the transmitted signal fulfils the relevant transmission standards.

The high-frequency module can achieve this either for a single given, predetermined standard (e.g., GSM, EDGE or W-CDMA) or also for different standards, wherein a given standard is selected via corresponding control signals, which are transmitted via the digital, standardized interface. Equivalent means, which enable the information of the high-frequency signal to be converted to the protocol used for the digital, standardized interface, may be provided in a corresponding high-frequency module for the reception of high-frequency signals.

By contrast, the similarly-converted, second high-frequency module 25' is connected to a second portion 58 of the digital-interface unit 23', wherein, in this context, by contrast with the exemplary embodiment discussed previously, the processing of the bitstream takes place in the measuring-device unit 2. The incoming high-frequency signal is supplied to the receiver device 29', which is illustrated in simplified form, and which, once again, has at its disposal a variable attenuation element 54 for adjusting the sensitivity of the high-frequency module 25'. The simplified receiver device 29 comprises a first local oscillator 32, which is adjusted according to the specifications of the frequency control 46, and mixes the incoming high-frequency signal to an intermediate-frequency level.

In the exemplary embodiment illustrated, this intermediate-frequency signal passes through a bandpass filter 59 and is then supplied to an analog-to-digital converter 60. The processing of the incoming signal is then complete for the modified, second high-frequency module 25', because this digital intermediate-frequency signal is passed on via the interface unit 27' to the second portion 58 of the digital interface 23'.

Accordingly, a majority of the signal-processing functionalities, which were previously implemented within a measuring device, are now implemented in the measuring-device unit 2, and, outside this measuring-device unit 2, only the processing of the high-frequency part is implemented in a high-frequency module 25'. A positioning immediately in the proximity of the device under test can be achieved, so that the transmission distance for the high-frequency signal between the device under test and the corresponding high-frequency module is particularly short.

The different interfaces shown in the exemplary embodiments can also be combined within one measuring system, for example, some of the ports provided on the measuring-device unit can form a standardized digital interface, while other ports of the measuring-device unit provide a digital interface, through which only digital data on the I/Q level can be transmitted.

An integration of the functions of several high-frequency modules, for example, of a transmitter module and a receiver module, in a common housing, which is connected to the measuring-device unit 2 only by one connecting line, is also possible. In fact, in this context, the structural size of the module is increased; however, the length of the transmission path between the device under test and the module remains short, because a module integrated in this manner can be positioned in the immediate proximity of the device under test.

While the present invention has been described in connection with a number of embodiments and implementations, the present invention is not so limited but covers various obvious modifications and equivalent arrangements, which fall within the purview of the appended claims.

What is claimed is:

1. A high-frequency measuring system for measuring a device under test, comprising:
    a measuring-device unit; and
    a first high-frequency module including a transmitter device configured to communicate with the device under test and a second high-frequency module including a receiver device configured to communicate with the device under test, wherein each high-frequency module is placed spatially separated from the measuring-device unit and each high-frequency module is connected to the measuring-device unit via a digital interface,
    wherein the measuring-device unit is configured to process input data input into the measuring-device unit to form a bitstream for transmission via the digital interface to the first high-frequency module, and the first high-frequency module is configured to subsequently forward the bitstream to the device under test using the transmitter device, the processing of the input data including assigning symbols to states in a state diagram of an I-Q (in phase-quadrature phase) level in the measuring-device unit,
    wherein one or more of the first high-frequency module and the second high-frequency module includes a local oscillator, and wherein the one or more high-frequency module including the local oscillator is provided in a housing that is separate from a housing of the measuring-device unit.

2. A high-frequency measuring system according to claim 1, wherein the digital interface is a serial interface.

3. A high-frequency measuring system according to claim 1, wherein the digital interface is a parallel interface.

4. A high-frequency measuring system according to claim 1, wherein the digital interface is an optical interface.

5. A high-frequency measuring system according to claim 1, wherein the digital interface is an electrical interface.

6. A high-frequency measuring system according to claim 1, wherein the at least one high-frequency module is supplied with electrical energy via a power-supply unit independent from the measuring-device unit.

7. A high-frequency measuring system according to claim 1, wherein a plurality of identical ports are provided on the measuring-device unit for the digital interface.

8. A high-frequency measuring system according to claim 1, wherein a plurality of different ports are provided on the measuring-device unit for the digital interface.

9. A high-frequency measuring system according to claim 1, wherein control data or user data is transmitted in a standardized form via the digital interface, and wherein the first high-frequency module comprises means for processing a high-frequency signal with regard to the transmission of data in standardized form via the digital interface or for processing the data transmitted in standardized form with regard to at least one predetermined transmission standard for the high-frequency signal.

10. A high-frequency measuring system according to claim 1, wherein the input data is manually input by any one of operating keys, a rotary knob, or arrow keys.

11. A high-frequency measuring system for measuring a device under test, comprising:
a measuring-device unit for receiving input data from a user; and
a first high-frequency module including a transmitter device configured to communicate with the device under test and a second high-frequency module including a receiver device configured to communicate with the device under test, wherein each high-frequency module is placed spatially separated from the measuring-device unit and each high-frequency module is connected to the measuring-device unit via a digital interface,
wherein the receiver device is configured to receive a message comprising a high-frequency signal originating from the device under test, the second high-frequency module being configured to process the high-frequency signal to form a first bitstream for transmission via the digital interface to the measuring-device unit, the processing, by the second high-frequency module, including converting the high-frequency signal to an intermediate-frequency signal and digitizing the intermediate-frequency signal for transmission via the digital interface to the measuring-device unit for evaluation of the message,
wherein the measuring-device unit is configured to process the input data to form a second bitstream for transmission via the digital interface to the first high-frequency module, and the first high-frequency module is configured to subsequently forward the second bitstream to the device under test using the transmitter device,
wherein one or more of the first high-frequency module and the second high-frequency module includes a local oscillator, and wherein the one or more high-frequency module including the local oscillator is provided in a housing that is separate from a housing of the measuring-device unit.

12. A high-frequency measuring system according to claim 11, wherein the conversion of the high-frequency signal to an intermediate-frequency signal includes receiving the high-frequency signal at the receiver device and subsequently mixing the high-frequency signal with a signal generated by the local oscillator, which is included as part of the second high-frequency module.

13. A high-frequency measuring system according to claim 12, wherein the intermediate-frequency signal is subdivided into an in-phase branch and a quadrature-phase branch and mixed in the in-phase branch with a signal generated by a second local oscillator.

14. A method for testing a device under test, comprising:
receiving input data from a user using a measuring-device unit;
forming, based on the input data, a first bitstream for transmission via a digital interface to a first high-frequency module, the first high-frequency module including a transmitter configured to communicate with the device under test to subsequently forward the first bitstream to the device under test, wherein the first bitstream forming includes assigning symbols to states relating to an I-Q (in phase-quadrature phase) level; and
receiving a second bitstream representative of high-frequency signal messages originating from the device under test via a second high-frequency module including a receiver configured to communicate with the device under test, the second high-frequency module processing the high-frequency signal messages to form the second bitstream, the processing, by the second high-frequency module, including converting the high-frequency signal messages to intermediate-frequency signals and digitizing the intermediate-frequency signals,
wherein one or more of the first high-frequency module and the second high-frequency module includes a local oscillator, and wherein the one or more high-frequency module including the local oscillator is provided in a housing that is separate from a housing of the measuring-device unit.

15. A method according to claim 14, further comprising:
determining a specific bit sequence to be transmitted to the device under test.

16. A method according to claim 15, further comprising:
generating one or more control signals in the bit sequence to control the first high-frequency module.

17. A method according to claim 14, wherein the input data is input by the user using any one of operating keys, a rotary knob, or arrow keys.

* * * * *